US010446721B2

(12) United States Patent
Lin et al.

(10) Patent No.: US 10,446,721 B2
(45) Date of Patent: Oct. 15, 2019

(54) LIGHT-EMITTING DEVICE

(71) Applicant: EPISTAR CORPORATION, Hsinchu (TW)

(72) Inventors: Yi-Hung Lin, Hsinchu (TW);
Chao-Hsing Chen, Hsinchu (TW);
Jia-Kuen Wang, Hsinchu (TW);
Tzu-Yao Tseng, Hsinchu (TW);
Jen-Chieh Yu, Hsinchu (TW);
Guan-Wu Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/880,908

(22) Filed: Jan. 26, 2018

(65) Prior Publication Data

US 2018/0212126 A1    Jul. 26, 2018

Related U.S. Application Data

(60) Provisional application No. 62/450,860, filed on Jan. 26, 2017.

(51) Int. Cl.
*H01L 33/40*    (2010.01)
*H01L 33/22*    (2010.01)
*H01L 33/46*    (2010.01)
*H01L 33/42*    (2010.01)
*H01L 33/62*    (2010.01)
(Continued)

(52) U.S. Cl.
CPC ............ *H01L 33/405* (2013.01); *H01L 33/22* (2013.01); *H01L 33/42* (2013.01); *H01L 33/46* (2013.01); *H01L 33/62* (2013.01); *F21K 9/23* (2016.08); *F21K 9/232* (2016.08); *F21K 9/69* (2016.08); *F21Y 2115/10* (2016.08); *H01L 33/0075* (2013.01); *H01L 33/06* (2013.01); *H01L 33/12* (2013.01); *H01L 33/32* (2013.01);
(Continued)

(58) Field of Classification Search
CPC ........ H01L 33/405; H01L 33/22; H01L 33/46
USPC .......................................................... 257/98
See application file for complete search history.

(56) References Cited

U.S. PATENT DOCUMENTS 8,878,224 B2*  11/2014  Ichihara .................. H01L 29/43
                                                                257/100
9,337,394 B2*   5/2016  Chen ....................... H01L 33/08
(Continued)

*Primary Examiner* — Igwe U Anya
(74) *Attorney, Agent, or Firm* — Muncy, Geissler, Olds & Lowe, P.C.

(57) ABSTRACT

A light-emitting device includes a semiconductor structure including a first semiconductor layer, a second semiconductor layer, and an active layer formed between the first semiconductor layer and the second semiconductor layer; a via penetrating the second semiconductor layer and the active layer to expose a surface of the first semiconductor layer; a first electrode formed in the via and on the second semiconductor layer; a second electrode formed on the second semiconductor layer; and an insulating structure covering the first electrode, the second electrode and the semiconductor structure and including a first opening to expose the first electrode and a second opening to expose the second electrode, wherein the first electrode and the second electrode respectively include a metal layer contacting the insulating layer, the metal layer includes a material including a surface tension value larger than 1500 dyne/cm and a standard reduction potential larger than 0.3 V.

19 Claims, 7 Drawing Sheets

(51) Int. Cl.
    *H01L 33/00*          (2010.01)
    *H01L 33/32*          (2010.01)
    *F21K 9/23*           (2016.01)
    *H01L 33/06*          (2010.01)
    *H01L 33/12*          (2010.01)
    *F21K 9/232*          (2016.01)
    *F21Y 115/10*         (2016.01)
    *F21K 9/69*          (2016.01)

(52) U.S. Cl.
    CPC ................ *H01L 2933/0016* (2013.01); *H01L 2933/0025* (2013.01)

(56) References Cited

U.S. PATENT DOCUMENTS

2011/0256699 A1* 10/2011 Masuda .............. H01L 21/0485
                                                                       438/571
2012/0049223 A1*  3/2012 Yang ........................ H01L 33/38
                                                                       257/98
2015/0144984 A1*  5/2015 Chen ........................ H01L 33/08
                                                                       257/99
2016/0284941 A1*  9/2016 Seo ......................... H01L 33/46

\* cited by examiner

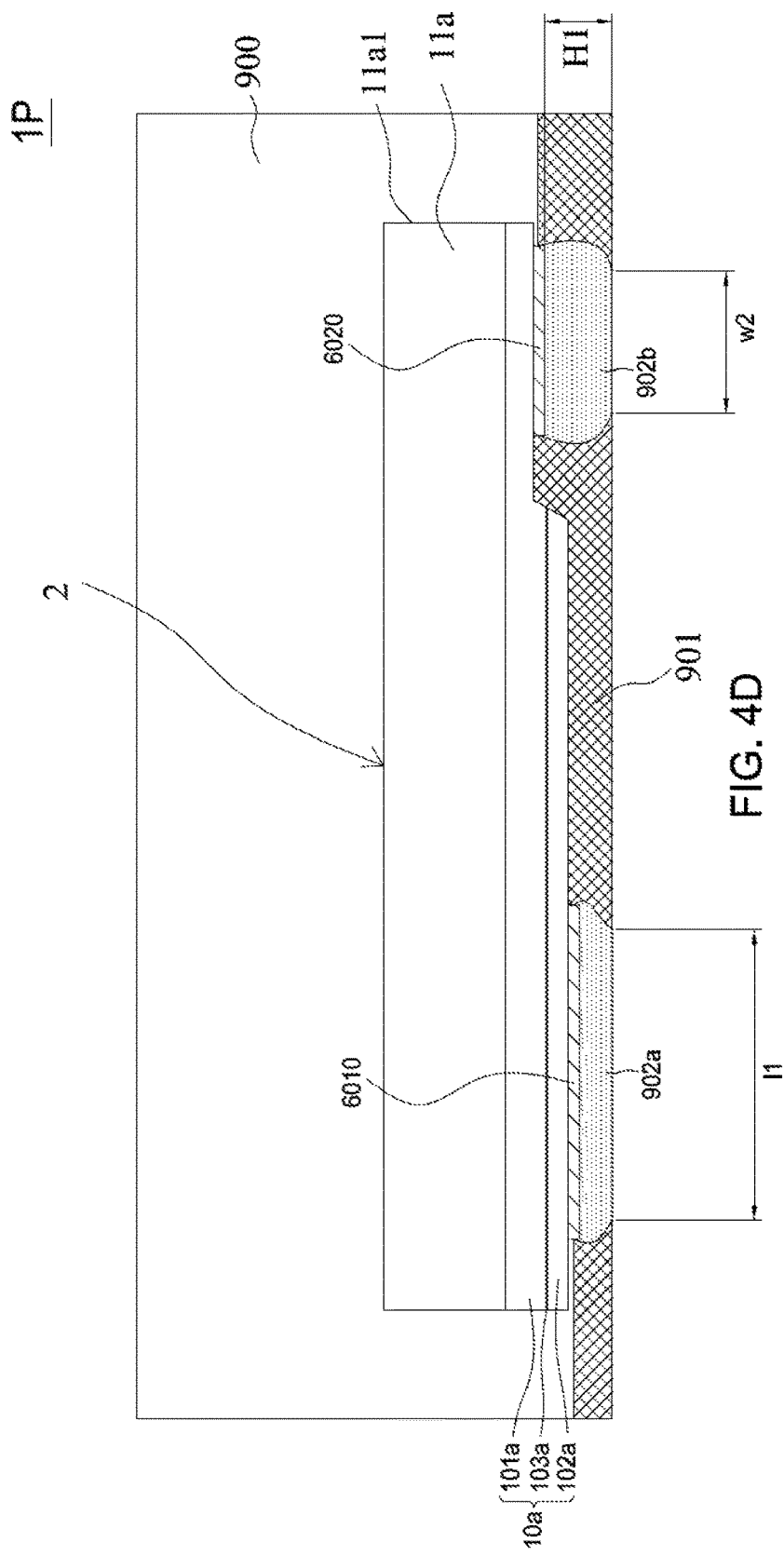

LIGHT-EMITTING DEVICE

REFERENCE TO RELATED APPLICATION

This application claims priority of U.S. Provisional Application No. 62/450,860 filed on Jan. 26, 2017 under 35 U.S.C. § 119(e), the entire contents of which are hereby incorporated by reference.

TECHNICAL FIELD

The application relates to a structure of a light-emitting device, and more particularly, to a light-emitting device including a semiconductor structure and a pad on the semiconductor structure.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, light-emitting diodes are widely used in household appliances, equipment indicators, and optoelectronic products.

SUMMARY OF THE APPLICATION

A light-emitting device includes a semiconductor structure including a first semiconductor layer, a second semiconductor layer, and an active layer formed between the first semiconductor layer and the second semiconductor layer; a via penetrating the second semiconductor layer and the active layer to expose a surface of the first semiconductor layer; a first electrode formed in the via and/or on the second semiconductor layer; a second electrode formed on the second semiconductor layer; and an insulating structure covering the first electrode, the second electrode and the semiconductor structure, including a first opening to expose the first electrode and a second opening to expose the second electrode, wherein the first electrode and the second electrode respectively includes a metal layer contacting the insulating structure, the metal layer includes a material including a surface tension value larger than 1500 dyne/cm and a standard reduction potential larger than 0.3 V.

A light-emitting device includes a semiconductor structure including a first semiconductor layer, a second semiconductor layer, and an active layer formed between the first semiconductor layer and the second semiconductor layer; a via penetrating the second semiconductor layer and the active layer to expose a surface of the first semiconductor layer; a first electrode formed in the via and/or on the second semiconductor layer; a second electrode formed on the second semiconductor layer; and an insulating structure covering the first electrode, the second electrode and the semiconductor structure, including a first opening to expose the first electrode and a second opening to expose the second electrode, wherein the first electrode and the second electrode respectively includes a metal layer contacting the insulating structure, the metal layer includes a material including a Young's modulus value larger than 100 GPa.

A light-emitting device includes a semiconductor structure including a first semiconductor layer, a second semiconductor layer, and an active layer formed between the first semiconductor layer and the second semiconductor layer; a via penetrating the second semiconductor layer and the active layer to expose a surface of the first semiconductor layer; a first electrode formed in the via and on the second semiconductor layer; a second electrode formed on the second semiconductor layer; an insulating structure covering the first electrode, the second electrode and the semiconductor structure, the insulating structure including a first opening to expose the first electrode and a second opening to expose the second electrode; a first thin pad formed in the first opening, the first thin pad having a thickness smaller than a thickness of the insulating structure; and a second thin pad formed in the second opening, the second thin pad having a thickness smaller than the thickness of the insulating structure.

A light-emitting device includes a semiconductor structure including a first semiconductor layer, a second semiconductor layer, and an active layer formed between the first semiconductor layer and the second semiconductor layer; a via penetrating the second semiconductor layer and the active layer to expose a surface of the first semiconductor layer; a first electrode formed in the via and/or on the second semiconductor layer; a second electrode formed on the second semiconductor layer; and an insulating structure covering the first electrode, the second electrode and the semiconductor structure, the insulating structure including a first opening to expose the first electrode and a second opening to expose the second electrode, wherein the first electrode and the second electrode are separated apart by a distance smaller than 50 μm.

A light-emitting device includes a semiconductor structure including a first semiconductor layer, a second semiconductor layer, and an active layer including a light-emitting area formed between the first semiconductor layer and the second semiconductor layer; an opening formed in the semiconductor structure to expose a surface of the first semiconductor layer; a first electrode formed in the opening; a second electrode formed on the second semiconductor layer; and an insulating structure covering the first electrode, the second electrode and the semiconductor structure, including a first opening to expose the first electrode and a second opening to expose the second electrode, wherein the first electrode and the second electrode occupy 10~20% of the light-emitting area of the light-emitting device.

BRIEF DESCRIPTION OF THE DRAWINGS

FIG. 4D shows a cross-sectional view taken along lines X-X of FIG. 4C;

DETAILED DESCRIPTION OF PREFERRED EMBODIMENTS

Figure 1:
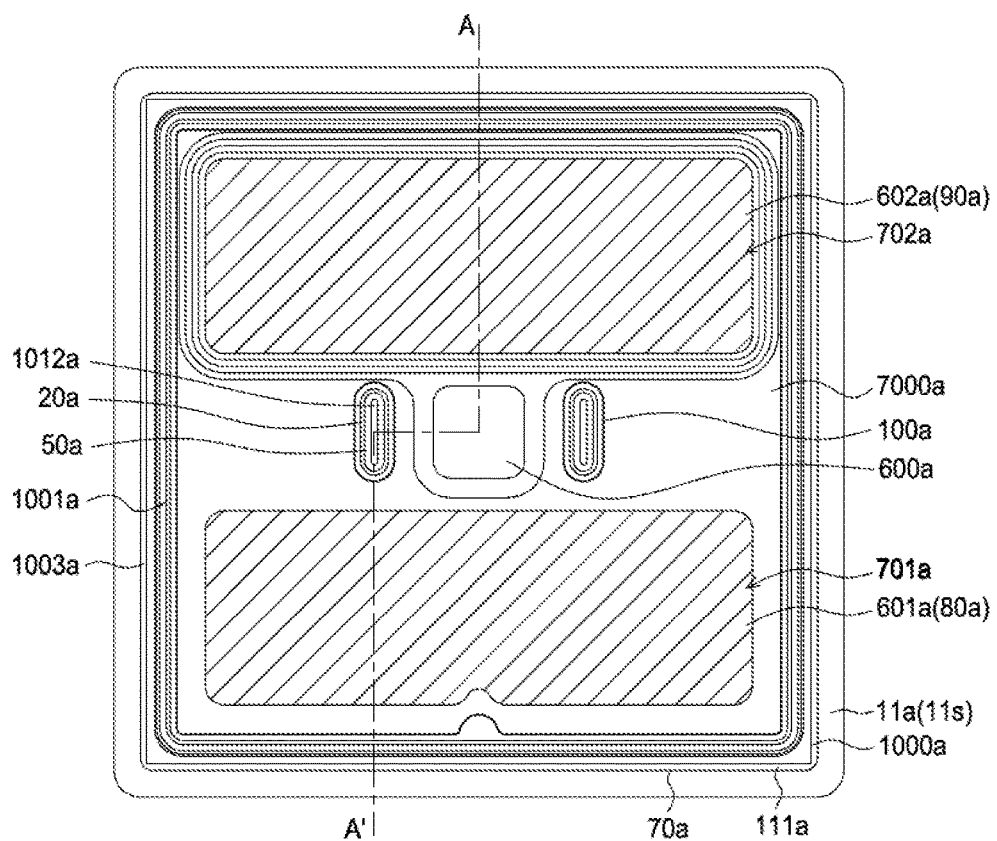
FIG. 1 illustrates a top view of a light-emitting devices 1 or 1a in accordance with embodiments of the present application.

The embodiment of the application is illustrated in detail, and is plotted in the drawings. The same or the similar part is illustrated in the drawings and the specification with the same number.

Figure 2:
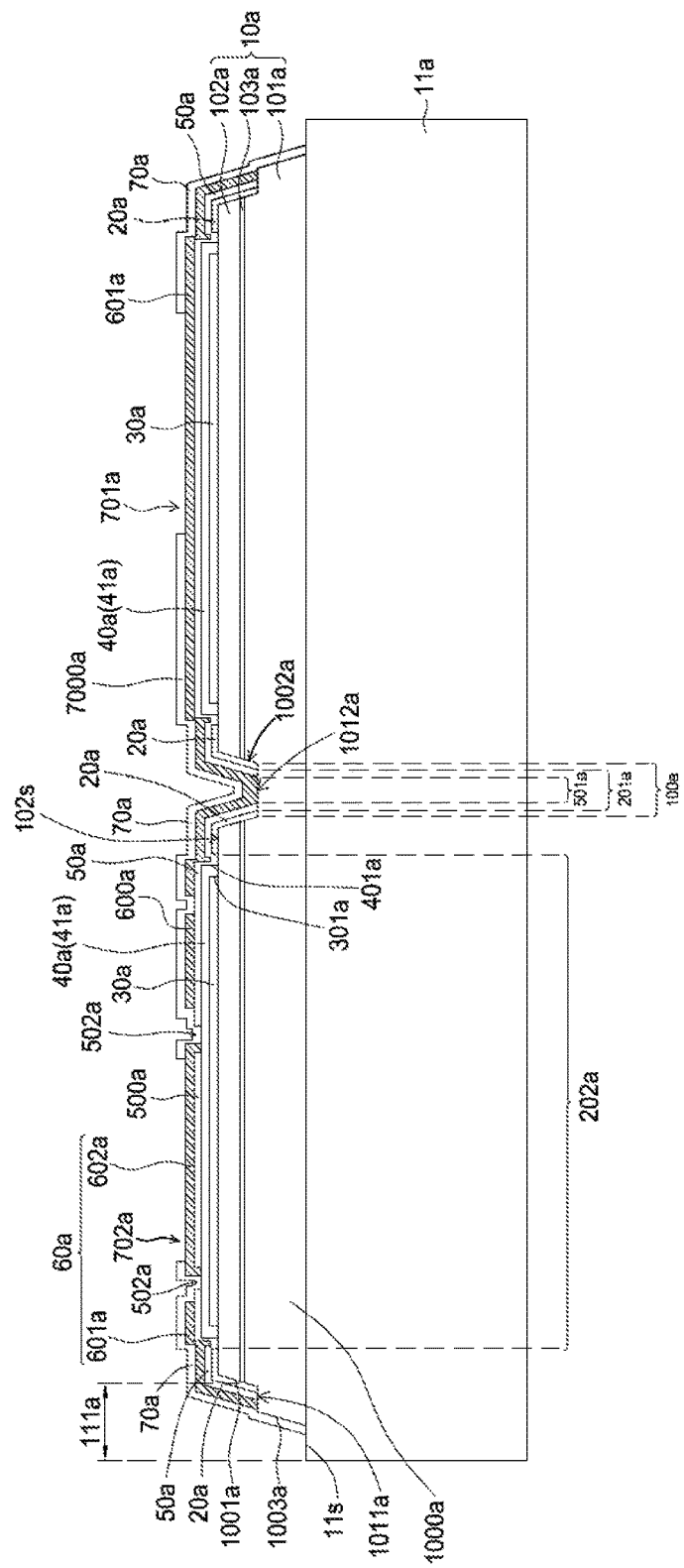
FIG. 2 illustrates a cross-sectional view of the light-emitting device 1 in accordance with an embodiment of the present application.
Figure 3:
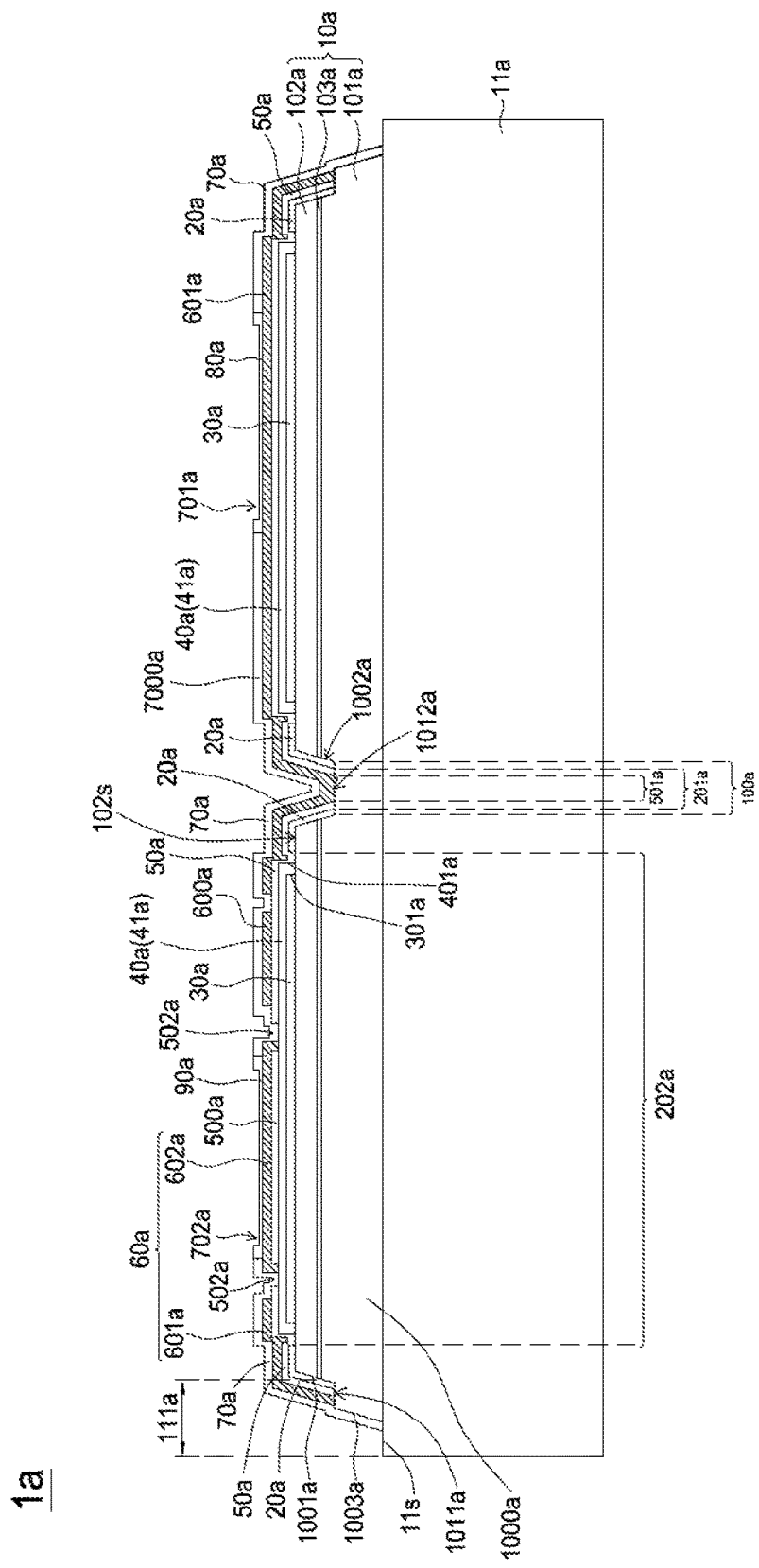
FIG. 3 illustrates a cross-sectional view of the light-emitting device 1a in accordance with an embodiment of the present application.

FIG. 1 illustrates a top view of the light-emitting devices 1 and 1a in accordance with two embodiments of the present application. FIG. 2 is a cross-sectional view of the light-emitting device 1 taken along line A-A' of FIG. 1 in accordance with an embodiment of the present application. FIG. 3 is a cross-sectional view of the light-emitting device 1a taken along line A-A' of FIG. 1 in accordance with another embodiment of the present application. Each of the light-emitting devices 1 and 1a disclosed in the present embodiment is a flip chip light-emitting diode. The light-emitting devices 1 and 1a include similar parts. The same or similar parts will be illustrated in FIGS. 1-3 with the same number and described below. The light-emitting device 1 or 1a includes a substrate 11a; one or more semiconductor structures 1000a on the substrate 11a; and a surrounding part 111a at and/or surrounding the one or more semiconductor structures 1000a. Each of the one or more semiconductor structures 1000a includes a semiconductor stack 10a including a first semiconductor layer 101a, a second semiconductor layer 102a, and an active layer 103a between the first semiconductor layer 101a and the second semiconductor layer 102a. As shown in FIG. 1, FIG. 2 and FIG. 3, parts of the second semiconductor layer 102a and the active layer 103a at and/or around an outer periphery of the one or more semiconductor structures 1000a are removed to expose a first surface 1011a of the first semiconductor layer 101a. In one embodiment, a part of the first semiconductor layer 101a can be further removed to expose an exposed surface 11s of the substrate 11a. The first surface 1011a is disposed at and/or along the outer periphery of the one or more semiconductor structures 1000a. In other words, the surrounding part 111a includes the first surface 1011a of the first semiconductor layer 101a which is a part of the semiconductor structure 1000a and/or the exposed surface 11s of the substrate 11a. So the surrounding part 111a is at and/or surrounds the outer periphery of the semiconductor structure 1000a.

The light-emitting device 1 or 1a further includes one or more openings, such as vias 100a passing through the second semiconductor layer 102a and the active layer 103a to expose one or more second surfaces 1012a of the first semiconductor layer 101a; and a contact layer 60a including a first contact part 601a and a second contact part 602a. The first contact part 601a is formed on the first surface 1011a of the first semiconductor layer 101a to surround the active layer 103a and at the outer periphery of the semiconductor structure 1000a. The first contact part 601a contacts the first semiconductor layer 101a to form an electrical connection therewith. The first contact part 601a is also formed on the one or more second surfaces 1012a of the first semiconductor layer 101a to cover the one or multiple vias 100a and contact the first semiconductor layer 101a to form an electrical connection therewith. In the present embodiment, in the top view of the light-emitting device 1 or 1a, the contact layer 60a includes a total surface area larger than a total surface area of the active layer 103a, and/or the contact layer 60a includes a peripheral length larger than a peripheral length of the active layer 103a. In one embodiment of the present application, the contact layer 60a further includes a pin region 600a and that will be described latter. In one embodiment of the present application, the opening includes a trench. In one embodiment, the multiple semiconductor structures 1000a are separated by the one or more openings, such as the trench, or connected to each other by the first semiconductor layer 101a. In one embodiment, the multiple semiconductor structures 1000a are physically separated by the one or more openings without the first semiconductor layer 101a connecting, and the one or more openings expose the substrate 11a.

In an embodiment of the present application, the substrate 11a can be a growth substrate for epitaxial growth of the semiconductor stack 10a, including gallium arsenide (GaAs) wafer for growing aluminum gallium indium phosphide (AlGaInP), sapphire ($Al_2O_3$) wafer, gallium nitride (GaN) wafer or silicon carbide (SiC) wafer for growing aluminum gallium indium nitride (AlGaInN).

In an embodiment of the present application, the substrate 11a includes a texture surface between the semiconductor structures 1000a and the substrate 11a, which can enhance the light extraction efficiency of the light-emitting device. The exposed surface 11s of the substrate 11a also includes a texture surface (not shown). Various configurations of texturing can be adopted, including random texturing, microlenses, microarrays, scattering regions or other optical regions. For example, the texture surface includes a plurality of protrusions, each protrusions may be about 0.5~2.5 μm in height, 1~3.5 μm in width and about 1~3.5 μm in pitch.

In an embodiment of the present application, the substrate 11a includes a sidewall, the sidewall includes a flat surface and/or a rough surface to enhance the light-extraction efficiency of the light-emitting device. In an embodiment of the present application, the sidewall of the substrate 11a can be inclined to a surface of the substrate 11a adjoined to the semiconductor structures 1000a to adjust the optical field distribution of the light-emitting device.

In an embodiment of the present application, the semiconductor stack 10a includes optical characteristics, such as light-emitting angle or wavelength distribution, and electrical characteristics, such as forward voltage or reverse current. The semiconductor stack 10a can be formed on the substrate 11a by organic metal chemical vapor deposition (MOCVD), molecular beam epitaxy (MBE), hydride vapor deposition (HVPE), or ion plating, such as sputtering or evaporation.

In an embodiment of the present application, the first semiconductor layer 101a and the second semiconductor layer 102a, such as a cladding layer, have different conductivity types, electrical properties, polarities, or doping elements for providing electrons or holes. For example, the first semiconductor layer 101a is an n-type semiconductor and the second semiconductor layer 102a is a p-type semiconductor. The active layer 103a is formed between the first semiconductor layer 101a and the second semiconductor layer 102a. The electrons and holes combine in the active layer 103a under a current driving to convert electric energy into light energy and then light is emitted from the active layer 103a. The wavelength of the light emitted from the light-emitting device 1 or the light-emitting device 1a is adjusted by changing the physical and chemical composition of one or more layers in the semiconductor stack 10a. The material of the semiconductor stack 10a includes a group III-V semiconductor material, such as $Al_xIn_yGa_{(1-x-y)}N$ or $Al_xIn_yGa_{(1-x-y)}P$, wherein 0≤x, y≤1; (x+y)≤1. According to the material of the active layer 103a, when the material of the semiconductor stack 10a is AlInGaP series material, red light having a wavelength between 610 nm and 650 nm or yellow light having a wavelength between 550 nm and 570 nm can be emitted. When the material of the semiconductor stack 10a is InGaN series material, blue or deep blue light having a wavelength between 400 nm and 490 nm or green light having a wavelength between 490 nm and 550 nm can be emitted. When the material of the semiconductor stack 10a is AlGaN series material, UV light having a wavelength between 400 nm and 250 nm can be emitted. The active layer 103a can be a single heterostructure (SH), a double heterostructure (DH), a double-side double heterostructure (DDH), or a multi-quantum well structure, MQW). The material of the active layer 103a can be i-type, p-type, or n-type semiconductor.

In an embodiment of the present application, a buffer layer (not shown) is formed between the semiconductor stack 10a and the substrate 11a to improve the epitaxial quality of the semiconductor stack 10a. In an embodiment, aluminum nitride (AlN) can be used as the buffer layer. In an embodiment, the method for forming aluminum nitride (AlN) is PVD, and the target is made of aluminum nitride. In another embodiment, a target made of aluminum which reacts in a nitrogen source environment with a PVD method is used to form aluminum nitride.

In an embodiment of the present application, the semiconductor stack 10a includes a first outside wall 1003a and a second outside wall 1001a, wherein one end of the first surface 1011a is connected to the first outside wall 1003a, and another end of the first surface 1011a is connected to the second outside wall 1001a. As shown in FIGS. 2-3, the first outside wall 1003a and the second outside wall 1001a both incline to the first surface 1011a. In another embodiment, the first outside wall 1003a is approximately perpendicular to the first surface 1011a, and the second outside wall 1001a is inclined to the first surface 1011a. In one embodiment, the first outside wall 1003a inclines to the exposed surface 11s of the substrate 11a. An angle between the first outside wall 1003a and the exposed surface 11s includes an acute angle. In one embodiment, an angle between the first outside wall 1003a and the exposed surface 11s includes an obtuse angle.

In an embodiment of the present application, as shown in FIGS. 2-3, the via 100a is defined by an inside wall 1002a and the second surface 1012a, wherein the inside wall 1002a exposes the second semiconductor layer 102a and the active layer 103a, and the second surface 1012a exposes the first semiconductor layer 101a. One end of the inside wall 1002a is connected to the second surface 1012a of the first semiconductor layer 101a and another end of the inside wall 1002a is connected to a surface 102s of the second semiconductor layer 102a.

In an embodiment of the present application, the light-emitting device 1 or 1a includes a first insulating structure 20a formed on the semiconductor structure 1000a by sputtering or vapor deposition. The first insulating structure 20a is formed on the first surface 1011a of the surrounding part 111a, extending along the second outside wall 1001a and onto the surface 102s of the second semiconductor layer 102a. The first insulating structure 20a is also formed on the second surface 1012a of the via 100a, extending along the inside wall 1002a and onto the surface 102s of the second semiconductor layer 102a. In one embodiment, the first insulating structure 20a includes one layer or multiple layers. The first insulating structure 20a protects the sidewall of the semiconductor structure 1000a to prevent the active layer 103a from being destroyed by the following processes.

When the first insulating structure 20a includes multiple layers, the first insulating structure 20a includes two or more layers having different refractive indexes alternately stacked to form a Distributed Bragg reflector (DBR). The DBR can protects the sidewalls of the semiconductor structure 1000a, and can further selectively reflect light of a specific wavelength emitted from the active layer 103a to outside of the light-emitting device 1 or 1a to enhance brightness. The first insulating structure 20a is formed of a non-conductive material including organic material, inorganic material or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone, glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$).

The first insulating structure 20a includes one or multiple first insulating first openings 201a to expose the first semiconductor layer 101a, and one or multiple first insulating second openings 202a to expose the second semiconductor layer 102a.

In an embodiment of the present application, the light-emitting device 1 or 1a includes a transparent conductive layer 30a formed on the surface 102s of the second semiconductor layer 102a. An outer edge 301a of the transparent conductive layer 30a is spaced apart from the first insulating structure 20a with a distance to expose the surface 102s of the second semiconductor layer 102a. Namely, the first insulating second opening 202a of the first insulating structure 20a exposes the second semiconductor layer 102a, and the transparent conductive layer 30a is formed in the first insulating second opening 202a to contact the second semiconductor layer 102a. Since the transparent conductive layer 30a is substantially formed on an entire surface of the second semiconductor layer 102a and contacts the second semiconductor layer 102a, the current can be uniformly spread throughout the entire second semiconductor layer 102a by the transparent conductive layer 30a. The material of the transparent conductive layer 30a includes a material being transparent to the light emitted from the active layer 103a, such as indium tin oxide (ITO) or indium zinc oxide (IZO).

In an embodiment of the present application, the light-emitting device 1 or 1a includes a reflective structure formed on the transparent conductive layer 30a. The reflective structure includes a reflective layer 40a, a barrier layer 41a or a combination of the above. An outer edge 401a of the reflective layer 40a can be disposed on the inner side or the outer side of the outer edge 301a of the transparent conductive layer 30a, or disposed to overlap and aligned with the outer edge 301a of the transparent conductive layer 30a. An outer edge (not shown) of the barrier layer 41a can be disposed on the inner side or the outer side of the outer edge 401a of the reflective layer 40a or provided to overlap and aligned with the outer edge 401a of the reflective layer 40a.

In an embodiment of the present application, the outer edge 301a of the transparent conductive layer 30a overlaps the first insulating structure 20a. Namely, the first insulating second opening 202a of the first insulating structure 20a exposes the second semiconductor layer 102a, and the transparent conductive layer 30a is formed in the first insulating second opening 202a to contact the second semiconductor layer 102a, and extends from the portion in the first insulating second opening 202a onto the first insulating second opening 202a. The outer edge 401a of the reflective layer 40a can be disposed on the inner side or the outer side of the outer edge 301a of the transparent conductive layer 30a. The reflective layer 40a is disposed to overlap the first insulating structure 20a.

In an embodiment of the present application, the light-emitting device 1 or 1a does not include the transparent conductive layer 30a and the reflective structure is directly formed on the surface 102s of the second semiconductor layer 102a.

In an embodiment of the present application, the reflective layer 40a includes one layer or multiple sub-layers, such as a Distributed Bragg reflector (DBR).

In an embodiment of the present application, the material of the reflective layer 40a includes a metal material having a high reflectance, for example, silver (Ag), aluminum (Al), rhodium (Rh), or an alloy of the above materials. The high reflectance referred to herein means having 80% or more reflectance for a wavelength of a light emitted from the light-emitting device 1 or 1a.

In an embodiment of the present application, the barrier layer 41a covers the reflective layer 40a to prevent the surface of the reflective layer 40a from being oxidized that deteriorates the reflectivity of the reflective layer 40a. The material of the barrier layer 41a includes metal material, such as titanium (Ti), tungsten (W), aluminum (Al), indium (In), tin (Sn), nickel (Ni), platinum (Pt), or an alloy of the above materials. The barrier layer 41a includes one layer or multiple sub-layers, such as titanium (Ti)/aluminum (Al) and/or titanium (Ti)/tungsten (W). In an embodiment of the present application, the barrier layer 41a includes titanium (Ti)/aluminum (Al) on one side of the barrier layer 41a away from the reflective layer 40a and titanium (Ti)/tungsten (W) on another side of the barrier layer 41a adjacent to the reflective layer 40a. In one embodiment of the present application, the material of the reflective layer 40a and the barrier layer 41a preferably includes a metal material other than gold (Au) or copper (Cu).

In an embodiment of the present application, the light-emitting device 1 or 1a includes a second insulating structure 50a formed on the semiconductor structure 1000a by sputtering or vapor deposition. The second insulating structure 50a includes one or multiple second insulating first openings 501a to expose the first semiconductor layer 101a and one or multiple second insulating second openings 502a to expose the reflective layer 40a, the barrier layer 41a and/or the transparent conductive layer 30a.

In an embodiment of the present application, parts of the transparent conductive layer 30a, the reflective layer 40a, the barrier layer 41a and/or the first insulating structure 20a are partially covered by the second insulating structure 50a. Other parts of the transparent conductive layer 30a, the reflective layer 40a, the barrier layer 41a and/or the first insulating structure 20a are totally covered by the second insulating structure 50a.

In an embodiment of the present application, a part of the second insulating structure 50a is formed in the first insulating second opening 202a and directly contacts the surface 102s of the second semiconductor layer 102a.

In an embodiment of the present application, the second insulating first openings 501a and the second insulating second openings 502a include different widths or numbers. The opening shapes of the second insulating first openings 501a and the second insulating second openings 502a include circular, elliptical, rectangular, polygonal, or arbitrary shape. A position of the one or multiple second insulating first openings 501a is formed to correspond to a position of the via 100a.

In an embodiment of the present application, the one second insulating second opening 502a is a groove surrounding a portion 500a of the second insulating structure 50a in the top view of the light-emitting device 1 or 1a.

In an embodiment of the present application, the second insulating structure 50a includes one layer or multiple layers. The second insulating structure 50a protects the sidewalls of the semiconductor structure 1000a to prevent destruction of the active layer 103a by subsequent processes. When the second insulating structure 50a includes multiple layers, the second insulating structure 50a includes two or more layers having different refractive index materials alternately stacked to form a Distributed Bragg reflector (DBR) The DBR can protects the sidewalls of the semiconductor structure 1000a and can further selectively reflect light of a specific wavelength emitted from the active layer 103a to outside of the light-emitting device 1 or 1a to enhance brightness. The second insulating structure 50a is formed of a non-conductive material including organic material, inorganic material or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$). The Distributed Bragg reflector (DBR) includes a low refractive index layer and a high refractive index layer, the material of the high refractive index layer is selected from $TiO_2$, ZnSe, $Si_3N_4$, $Nb_2O_5$, or $Ta_2O_5$, and the material of the low refractive index layer is selected from $SiO_2$, $MgF_2$, or $CaF_2$.

In an embodiment of the present application, the first insulating structure 20a comprises a material different from that of the second insulating structure 50a. For example, the first insulating structure 20a comprises $Si_3N_4$, and the second insulating structure 50a comprises $SiO_2$. Since $Si_3N_4$ has a higher etching selectivity than $SiO_2$, the first insulating structure 20a including $Si_3N_4$ is used to be a mask for forming the one or more semiconductor structures 1000a. Because $SiO_2$ has a better step coverage rate than $Si_3N_4$, the second insulating structure 50a including $SiO_2$ is used as a protecting layer covering the side surface of the second semiconductor layer 102a and the active layer 103a.

In an embodiment of the present application, the contact layer 60a can be formed on the first semiconductor layer 101a and the second semiconductor layer 102a by sputtering or vapor deposition. In one embodiment, the first contact part 601a of the contact layer 60a can be a first electrode and the second contact part 602a can be a second electrode. The first electrode 601a and the second electrode 602a are used for connecting an outside power supplier by wire bonding or solder bumping. The first electrode 601a is formed in the via 100a, and extends along the inside wall 1002a and onto a surface of the second insulating structure 50a. The first electrode 601a formed at the via 100a and the second insulating first openings 501a contacts the first semiconductor layer 101a and electrically connected to the first semiconductor layer 101a. The second electrode 602a is formed on the semiconductor structure 1000a, and the portion 500a of the second insulating structure 50a is formed therebetween. The second electrode 602a extends from the part on the portion 500a into the second insulating second opening 502a to contact the reflective layer 40a, the barrier layer 41a or the transparent conductive layer 30a. The second electrode 602a is electrically connected to the second semiconductor layer 102a through the reflective layer 40a, the barrier layer 41a or the transparent conductive layer 30a.

In an embodiment of the present application, the light-emitting device 1 includes a third insulating structure 70a formed by sputtering or vapor deposition and covering the first electrode 601a, the second electrode 602a and the semiconductor stack 10a. The third insulating structure 70a includes a first opening 701a to expose the first electrode 601a and a second opening 702a to expose the second electrode 602a. The third insulating structure 70a includes one layer or multiple layers. The third insulating structure 70a can protect the sidewalls of the semiconductor structure 1000a to prevent destruction of the active layer 103a by subsequent processes. When the third insulating structure 70a includes multiple layers, the third insulating structure 70a includes two or more layers having different refractive index alternately stacked to form a Distributed Bragg reflector (DBR) The DBR can protect the sidewalls of the semiconductor structure 1000a and can further reflect light of a specific wavelength emitted from the active layer 103a to outside of the light-emitting device 1 or 1a to enhance brightness. The third insulating structure 70a is formed of a non-conductive material including organic material, inorganic material or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$).

In an embodiment of the present application, the contact layer 60a further includes the pin region 600a surrounded and covered by the third insulating structure 70a. In an embodiment, the pin region 600a includes same materials as that of the first electrode 601a and the second electrode 602a. The pin region 600a is electrically isolated to the semiconductor stack 10a by the second insulating structure 50a and the third insulating structure 70a. The pin region 600a is separated apart from the first electrode 601a and the second electrode 602a by the third insulating structure 70a. From a top view of the light-emitting device 1, the light-emitting device 1 includes a rectangular shape having four corners. The pin region 600a is located at or near an intersection of two diagonals of the rectangular shape.

In an embodiment of the present application, the first electrode 601a and/or the second electrode 602a includes one layer or multiple layers. In an embodiment, in order to improve the adhesion between the reflective structure and the contact layer 60a, the first electrode 601a and/or the second electrode 602a includes an adhesive layer closest to the first semiconductor layer 101a or the second semiconductor layer 102a. The material of the adhesive layer includes chromium (Cr), titanium (Ti) or rhodium (Rh). In an embodiment, in order to improve the reflectivity of the contact layer 60a, the first electrode 601a and/or the second electrode 602a includes a reflecting layer above the adhesive layer. The material of the reflecting layer includes aluminum (Al) or silver (Ag). In an embodiment, in order to improve a bonding strength between the contact layer 60a and the solder (not shown) and/or a bonding strength between the contact layer 60a and the third insulating structure 70a, the first electrode 601a and/or the second electrode 602a includes a bonding layer. The bonding layer includes a metal material including a surface tension value larger than 1500 dyne/cm and a standard reduction potential larger than 0.3 V. For example, the bonding layer includes platinum (Pt). The value of the standard reduction potential is given in voltage (V) relative to the standard hydrogen electrode at a temperature of 298.15 K (25° C.) and at a pressure of 101.325 kPa (1 atm). In an embodiment, the bonding layer includes a metal material having a positive standard reduction potential in respect to the standard hydrogen electrode under a reduction reaction of metal element. The surface tension value is measured in force per unit length at the melting point of the metal material.

In an embodiment of the present application, in order to avoid of a crack penetrated from the contact layer 60a into the semiconductor structure 1000a when the contact layer 60a is bonded to a package carrier, the bonding layer preferably includes an enough stiffness to afford the bonding strength. In an embodiment, the bonding layer includes a metal material including a Young's modulus value larger than 100 GPa. For example, the bonding layer includes platinum (Pt).

In an embodiment of the present application, in order to improve the light extraction of the light-emitting device 1 via increasing the reflectivity of the contact layer 60a, the first electrode 601a and the second electrode 602a occupy 40% above of the light-emitting area of the light-emitting device 1. The first electrode 601a and the second electrode 602a are separated apart by a distance smaller than 50 μm. In an embodiment, the distance is smaller than 30 μm. In an embodiment, the distance is smaller than 10 μm. From a top view of the light-emitting device 1, the second electrode 602a includes a surface area smaller than a surface of the first electrode 601a. The second electrode 602a is surrounded by the first electrode 601a. In an embodiment, a portion of the first electrode 601a formed on the surrounding part 111a encloses the semiconductor structure 1000a.

In an embodiment, the first electrode 601a is formed on the surrounding part 111a, extends from the first surface 1011a of the first semiconductor layer 101a, along the second outside wall 1001a to overlap the surface 102s of the second semiconductor layer 102a.

In an embodiment, the first electrode 601a is formed on the surrounding part 111a, extends from the exposed surface 11s of the substrate 11a, along the first surface 1011a of the first semiconductor layer 101a and the second outside wall 1001a, to overlap the surface 102s of the second semiconductor layer 102a.

In an embodiment of the present application, in order to improve the bonding strength between the contact layer 60a and solder bumps, the first electrode 601a and/or the second electrode 602a includes a thickness between 1 μm and 3 μm.

In an embodiment of the present application, as shown in FIG. 3, the structure of the light-emitting device 1a is similar to that of the light-emitting device 1. The light-emitting device 1a further includes a first thin pad 80a formed in the first opening 701a of the third insulating structure 70a and on the first electrode 601a, and a second thin pad 90a formed in the second opening 702a of the third insulating structure 70a and on the second electrode 602a. The first thin pad 80a has a thickness smaller than a thickness of the third insulating structure 70a. The second thin pad 90a having a thickness smaller than a thickness of the third insulating structure 70a. For example, the first thin pad 80a and/or the second thin pad 90a includes a thickness between 0.1 μm and 1 μm, the third insulating structure 70a includes a thickness between 0.5 μm and 2.5 μm.

In an embodiment of the present application, in order to reduce a height difference between the first electrode 601a and the second electrode 602a, the second insulating structure 50a further includes the portion 500a formed under the second electrode 602a. Multiple sidewalls of the portion 500a of the second insulating structure 50a are covered by the second electrode 602a.

In an embodiment of the present application, in order to prevent electrical short between the first electrode 601a and the second electrode 602a, the second opening 702a of the third insulating structure 70a is narrower than the second insulating second opening 502a of the second insulating structure 50a, and the second insulating second opening 502a of the second insulating structure 50a is narrower than the first insulating second opening 202a of the first insulating structure 20a. Specifically, part of the third insulating structure 70a is formed in the second insulating second openings 502a of the second insulating structure 50a. The third insulating structure 70a also extends onto the second electrode 602a. The second opening 702a of the third insulating structure 70a is formed on a top surface of the second electrode 602a.

In an embodiment of the present application, in order to increase the exposed surface of the second electrode 602a for flipping bonding, such as eutectic bonding or solder bumping, the second opening 702a of the third insulating structure 70a is wider than the second insulating second opening 502a of the second insulating structure 50a, and the second insulating second opening 502a of the second insulating structure 50a is narrower or wider than the first insulating second opening 202a of the first insulating structure 20a.

In an embodiment of the present application, as shown in FIG. 3, a top surface of the first thin pad 80a or the second thin pad 90a is lower than a top surface of the third insulating structure 70a. An entirety of the first thin pad 80a or the second thin pad 90a is formed inside the first opening 701a or the second opening 702a.

In an embodiment of the present application, a top surface of the first thin pad 80a or the second thin pad 90a is high than a top surface of the third insulating structure 70a. The first thin pad 80a or the second thin pad 90a is formed in the first opening 701a or the second opening 702a and extends onto the top surface of the third insulating structure 70a.

In an embodiment of the present application, part of first thin pad 80a and/or the second thin pad 90a extending onto the top surface of the third insulating structure 70a includes a thickness thicker than a thickness of the third insulating structure 70a.

In an embodiment of the present application, the first thin pad 80a includes a projected surface on the substrate 11a which is smaller than a projected surface of the first contact part 601a on the substrate 11a. The second thin pad 90a includes a projected surface on the substrate 11a which is smaller or larger than a projected surface of the second contact part 602a on the substrate 11a.

In an embodiment of the present application, the first thin pad 80a and the second thin pad 90a are separated apart by a distance larger than 50 μm, the pin region 600a is disposed between the first thin pad 80a and the second thin pad 90a, and also between the first contact part 601a and the second contact part 602a. In other words, the pin region 600a is not covered by the first thin pad 80a and the second thin pad 90a, and also separated from the first contact part 601a and the second contact part 602a.

Figure 4A:
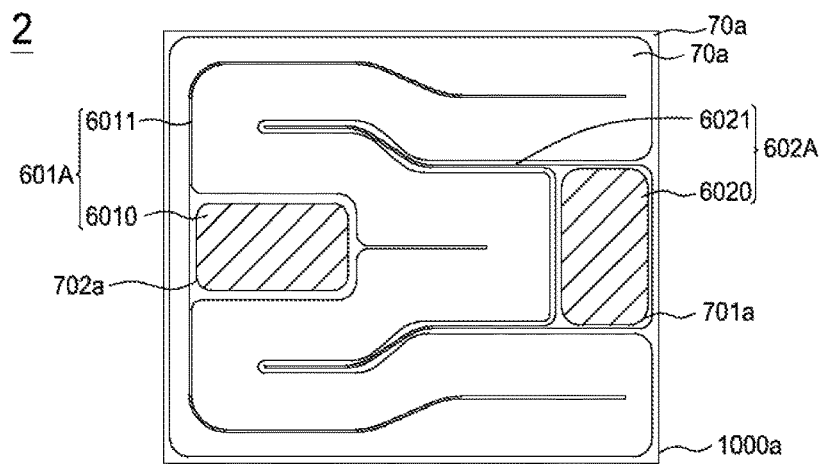
FIG. 4A illustrates a top view of a light-emitting device 2 in accordance with an embodiment of the present application.

FIG. 4A illustrates a top view of the light-emitting device 2 in accordance with an embodiment of the present application. For clear illustration, each layer is drawn in solid line regardless of its material being non-transparent, transparent, or semi-transparent.

The light-emitting device 2 includes the substrate, the semiconductor structure 1000a, a first electrode 601A and a second electrode 602A, and the third insulating structure 70a. The substrate (not shown), the semiconductor structure 1000a and the third insulating structure 70a of the light-emitting device 2 are similar to those of the light-emitting devices 1 and 1a. In order to improve the light extraction and the current spreading of the light-emitting device 2, the light-emitting device 2 includes the first electrode 601A and the second electrode 602A, wherein the first electrode 601A and the second electrode 602A occupy 10~20% of the light-emitting area of the light-emitting device 2. The first electrode 601A includes a first bonding pad 6010 and one or multiple first extensions 6011 extending from the first bonding pad 6010. The second electrode 602A includes a second bonding pad 6020 and one or multiple second extensions 6021 extending from the second bonding pad 6020. The multiple first extensions 6011 and the multiple second extensions 6021 are not overlapped.

The third insulating structure 70a covers the top surface and the side surfaces of the semiconductor structure 1000a. In this embodiment, the first electrode 601A has two first extensions 6011 and the second electrode 602A has two second extensions 6021. The third insulating structure 70a also covers the first extensions 6011 and the second extensions 6021 and exposes partial surfaces of the first bonding pad 6010 (the hatch area) and the second bonding pad 6020 (the hatch area) by the first opening 701a and the second opening 702a respectively. In an embodiment, the first semiconductor layer 101a is an n-type semiconductor, and the second semiconductor layer 102a is a p-type semiconductor. The n-type semiconductor and the p-type semiconductor are covered by the third insulating structure 70a (referring to FIG. 3).

Figure 4B:
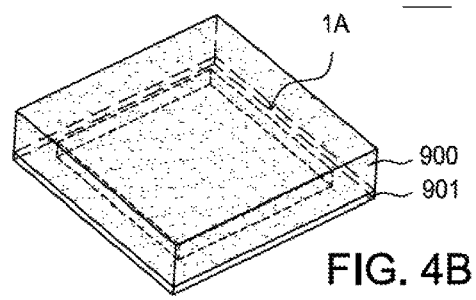
FIG. 4B shows a perspective view of a light-emitting package 1P in accordance with an embodiment of the present application.
Figure 4C:
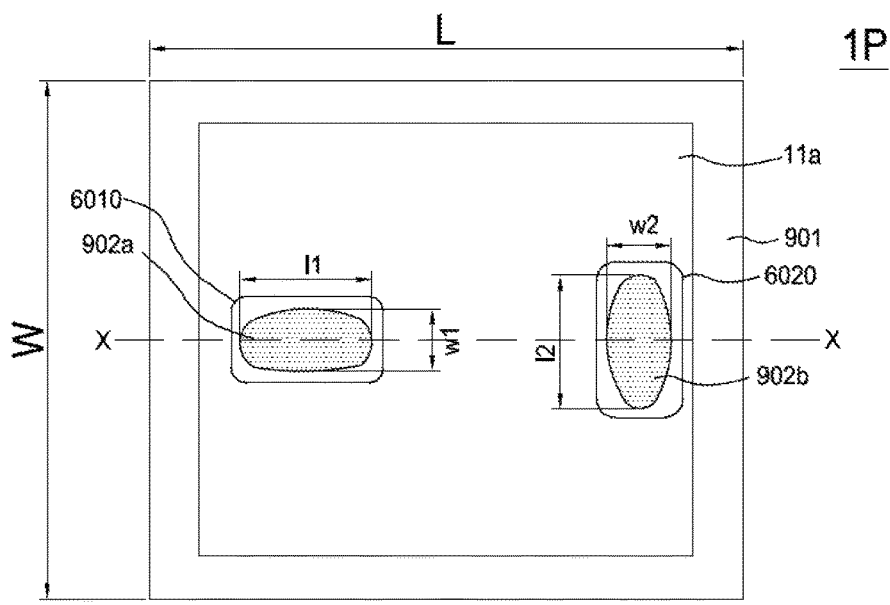
FIG. 4C shows a bottom view of the light-emitting package 1P.

In one embodiment, each of the first bonding pad 6010 and the second bonding pad 6020 includes a metal multilayer, for example Cr/Al/Cr/Al/Ni/Pt, Cr/Al/Cr/Al/Ni/Au, Cr/Al/Cr/Al/Ni/Pt/Au, or Ti/Al/Ti/Al/Ni/Pt/Au, and the Pt or Au layer directly contacts the third insulating structure 70a and the metal bumps 902a, 902b (shown in FIG. 4C or 4D). Since the Pt or Au layer will react with the metal bumps (for example, solder) to form intermetallic compounds (IMCs), the Pt or Au layer may not be observed by Scanning Electron Microscope (SEM) or the IMCs layer is observed by SEM. In an embodiment, the IMCs layer is also not observed by SEM and the Ni layer directly contacts the metal bumps while analyzed by SEM. In an embodiment, the Pt or Au layer may not completely react with the metal bumps and the Pt or Au layer is observed by SEM.

FIG. 4B shows a perspective view of a light-emitting package 1P in accordance with an embodiment of the present application. FIG. 4C shows a bottom view of the light-emitting package 1P. FIG. 4D shows a cross-sectional view taken along lines X-X of FIG. 4C. The light-emitting package 1P includes the light-emitting device 1A, a light-transmitting body 900, a reflective body 901, and metal bumps 902a, 902b.

In FIG. 4C, for clear illustration, the exposed first bonding pad 6010, the exposed second bonding pad 6020 and the substrate 11a are shown. In the product, only the reflective body 901 and the metal bumps 902a, 902b can be seen from the bottom view. The metal bump 902a has a first area occupying 0.5~3% (for example, 1.15%, 1.75%, 2% or 3%) of a third area of the light-emitting package 1P. The metal bump 902b has a second area occupying 0.5~3% (for example, 1.15%, 1.75%, 2% or 3%) of the third area of the light-emitting package 1P. Accordingly, the metal bumps 902a, 902b have the areas occupying 1~6% (for example, 2.3%, 3.5%, 4% or 6%) of the third area of the light-emitting package 1P.

For example, the light-emitting package 1P has a substantially rectangular shape with a length (L) and a width (W). The third area is measured by length (L)*width (W). The metal bump has a substantially oval shape with a maximum length and a maximum width which are measured from the bottom view. In other words, the maximum length and a maximum width are measured at the bottommost surface shown in FIG. 4D. The first area is measured by length (l1)*width (w1). The second area is measured by length (l2)*width (w2)

For simplified illustration, the substrate 11a and the semiconductor stack 10a are shown in FIG. 4D and other structures (for example, the insulating structures 20a, 50a, 70a) are not shown in FIG. 4D. The related descriptions can be referred FIG. 2 or 3 and the corresponding paragraphs. In addition, the first bonding pad 6010 and the second bonding pad 6020 substantially have the same thickness or the second bonding pad 6020 has a thickness thicker than the first bonding pad 6010. The metal bump 902b has the thickness greater than the metal bump 902a or equal to the metal bump 902a.

In FIG. 4D, the light-transmitting body 900 covers side surfaces 11a1 of the substrate 11a. The metal bumps 902a, 902b are formed on the first bonding pad 6010 and the second bonding pad 6020, respectively. Specifically, the metal bump 902a directly contacts a portion of a sidewall of the first bonding pad 6010 and a bottom surface of the first bonding pad 6010. The metal bump 902b directly contacts a portion of a sidewall of the second bonding pad 6020 and a bottom surface of the second bonding pad 6020. The reflective body 901 covers a portion of a sidewall of the metal bumps 902a, 902b. The reflective body 901 also covers a portion of the sidewalls of first bonding pad 6010 and the second bonding pad 6020 which are not covered by the metal bumps 902a, 902b.

The metal bump (902a, 902b) includes a lead-free solder containing at least one material selected from the group consisting of tin, copper, silver, bismuth, indium, zinc, and antimony. The metal bump has a height (for example, H1) between 20 µm~150 µm. In one embodiment, the metal bump is formed by using reflow soldering process. A solder paste is placed on the bonding pad and then heated in a reflow oven to melt the solder paste and create a joint. The solder paste can include Sn—Ag—Cu, Sn—Sb or Au—Sn, and have a melting point greater than 215° C., or greater than 220° C., or of 215° C.~240° C. (for example, 217° C. 220° C., 234° C.) In addition, a peak temperature in the reflow soldering process (the peak temperature is usually happened in a stage, called "reflow zone") is greater than 250° C., or greater than 260° C., or of 250° C.~270°. (for example, 255° C., 265° C.).

The reflective body 901 is an electrically insulative body and includes a first matrix and a plurality of reflective particles (not shown) dispersed in the first matrix. The first matrix includes silicone-based material or epoxy-based material, and has a refractive index (n) of 1.4~1.6 or 1.5~1.6. The reflective particles include titanium dioxide, silicon dioxide, aluminum oxide, zinc oxide, or zirconium dioxide. In one embodiment, when light emitted from the semiconductor stack 10a strikes the reflective body 901, the light can be reflected, and the reflection of light is referred to diffuse reflection. In addition to the reflection, the reflective body 901 can also function as a mechanical support and sustain the stress occurred during the operation of the light-emitting package 1P.

The light-transmitting body 900 includes silicone-based material or epoxy-based material. Furthermore, the light-transmitting body 900 can include a plurality of wavelength conversion particles (not shown) or/and diffusing particles dispersed therein to absorb and convert a first light from the semiconductor stack 10a into a second light with a peak wavelength or dominant wavelength different from that the first light. The first light is mixed with the second light to produce a third light. In this embodiment, the third light has chromaticity coordinates (x, y) on CIE 1931 chromaticity diagram, wherein $0.27 \leq x \leq 0.285$; $0.23 \leq y \leq 0.26$. In another embodiment, the first light is mixed with the second light to produce a third light, such as a white light. Based on the weight percentage and the material of the wavelength-conversion particles, the light-emitting package has a correlated color temperature of about 2200K~6500K (ex. 2200K, 2400K, 2700K, 3000K, 5000K 5700K, 6500K) under a thermal stable state with a color point (CIE x, y) within a five-step MacAdam ellipse and with a color rendering index (CRI) greater than 80 or 90. In another embodiment, the first light is mixed with the second light to produce purple light, amber light, green light, yellow light or other non-white light.

The wavelength conversion particles have a particle size of 10 nm-100 µm and include one or more (a plurality of) kinds of inorganic phosphor, organic fluorescent colorants, semiconductors, or combinations thereof. The inorganic phosphor includes but is not limited to, yellow-greenish phosphor or red phosphor. The yellow-greenish phosphor comprises aluminum oxide (such as YAG or TAG), silicate, vanadate, alkaline-earth metal selenide, or metal nitride. The red phosphor includes fluoride ($K_2TiF_6:Mn^{4+}$, $K_2SiF_6:Mn^{4+}$), silicate, vanadate, alkaline-earth metal sulfide (CaS), metal nitride oxide, a mixture of tungstate and molybdate. The weight percentage (w/w) of the wavelength-conversion particles within the matrix is between 50%~70%. The semiconductors include crystal with nano-sizes, for example, quantum dot. The quantum dot can be ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, CuInS, $CsPbCl_3$, $CsPbBr_3$, or $CsPbI_3$.

The diffusing particles include titanium dioxide, silicon dioxide, aluminum oxide, zinc oxide, or zirconium dioxide for diffusing the light emitted from the semiconductor stack 10a.

Figure 5:
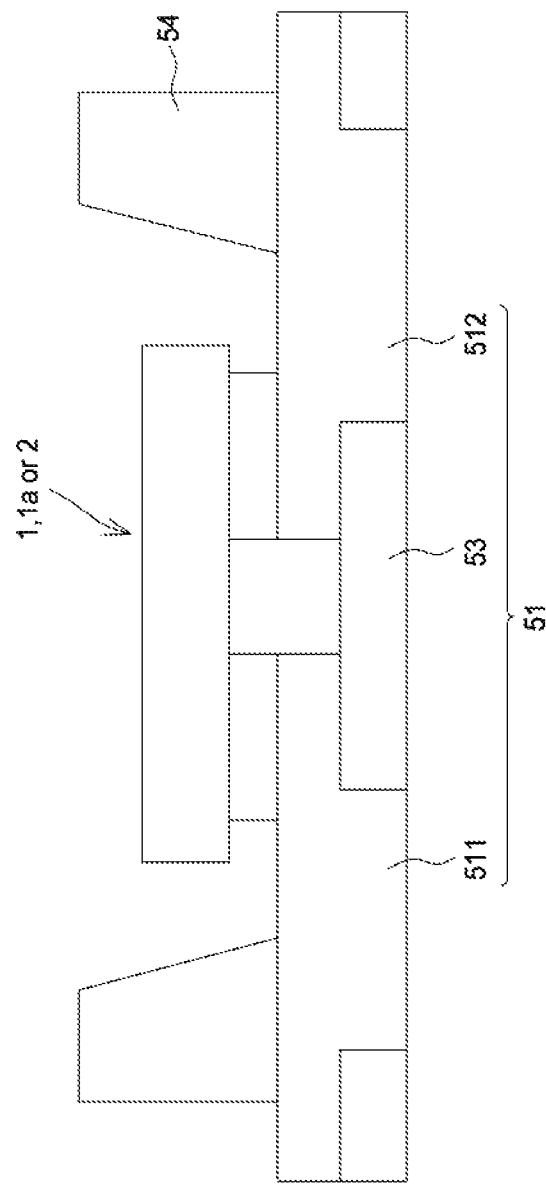
FIG. 5 illustrates a schematic view of a light-emitting apparatus 3 in accordance with an embodiment of the present application.

FIG. 5 is a schematic view of a light-emitting apparatus 3 in accordance with an embodiment of the present application. The light-emitting device 1, 1a, or 2 in the foregoing embodiment is mounted on the first spacer 511 and the second spacer 512 of the package substrate 51 in the form of flip chip. The first spacer 511 and the second spacer 512 are electrically insulated from each other by an insulating portion 53 including an insulating material. The main light-extraction surface of the flip-chip is one side of the growth substrate 11a opposite to the electrode-forming surface. A reflective structure 54 can be provided around the light-emitting device to increase the light extraction efficiency of the light-emitting apparatus 3.

Figure 6:
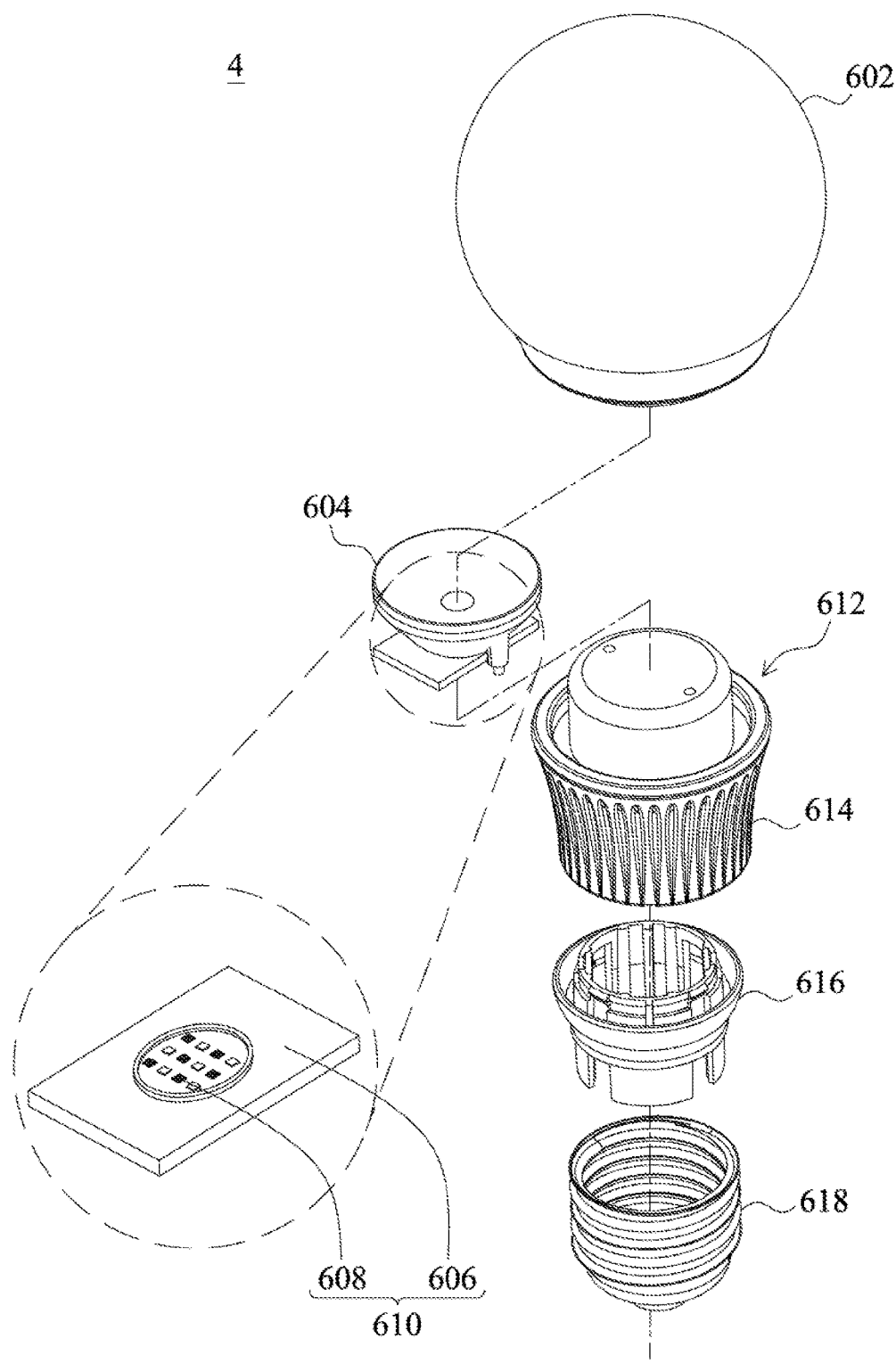
FIG. 6 illustrates a structure diagram of a light-emitting apparatus 4 in accordance with an embodiment of the present application.

FIG. 6 illustrates a structure diagram of a light-emitting apparatus 4 in accordance with an embodiment of the present application. A light bulb includes an envelope 602, a lens 604, a light-emitting module 610, a base 612, a heat sink 614, a connector 616 and an electrical connecting device 618. The light-emitting module 610 includes a submount 606 and a plurality of light-emitting devices 608 on the submount 606, wherein the plurality of light-emitting devices 608 can be the light-emitting devices 1, 1a, 2 or the light-emitting apparatus 3 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
    a semiconductor structure comprising a first semiconductor layer, a second semiconductor layer, and an active layer between the first semiconductor layer and the second semiconductor layer;
    a part penetrating the second semiconductor layer and the active layer to expose a surface of the first semiconductor layer;
    a first electrode formed in the part and on the second semiconductor layer;
    a second electrode formed on the second semiconductor layer;
    a third insulating structure covering the first electrode, the second electrode and the semiconductor structure, the third insulating structure comprising a first opening to expose the first electrode and a second opening to expose the second electrode, wherein the first electrode and the second electrode respectively comprises a metal layer contacting the third insulating structure, the metal layer comprises a material comprising a surface tension value larger than 1500 dyne/cm and a standard reduction potential larger than 0.3 V;
    a first thin pad formed in the first opening, the first thin pad having a thickness smaller than a thickness of the third insulating structure; and
    a second thin pad formed in the second opening, and the second thin pad having a thickness smaller than the thickness of the third insulating structure,
    wherein the third insulating structure comprises a top surface, the first thin pad extends onto the top surface of the third insulating structure or the second thin pad extends onto the top surface of the third insulating structure.

2. The light-emitting device according to claim 1, wherein the second electrode is surrounded by the first electrode in a top view of the light-emitting device.

3. The light-emitting device according to claim 1, wherein the part is at an outer periphery of the semiconductor structure and surrounds the outer periphery of the semiconductor structure.

4. The light-emitting device according to claim 3, wherein the first electrode surrounds the outer periphery of the semiconductor structure.

5. The light-emitting device according to claim 1, wherein the first electrode and the second electrode occupy 10~20% of a light-emitting area of the light-emitting device.

6. The light-emitting device according to claim 1, wherein the first electrode and the second electrode are separated apart by a distance smaller than 50 μm.

7. A light-emitting device, comprising:
    a semiconductor structure comprising a first semiconductor layer, a second semiconductor layer, and an active layer between the first semiconductor layer and the second semiconductor layer;
    a surrounding part exposing the first semiconductor layer, wherein the surrounding part is at an outer periphery of the semiconductor structure and surrounds the outer periphery of the semiconductor structure;
    a first electrode formed at the surrounding part and on the second semiconductor layer;
    a second electrode formed on the second semiconductor layer;
    a third insulating structure covering the first electrode, the second electrode and the semiconductor structure, the third insulating structure comprising a first opening to expose the first electrode and a second opening to expose the second electrode;
    a first thin pad formed in the first opening, the first thin pad having a thickness smaller than a thickness of the third insulating structure; and
    a second thin pad formed in the second opening, and the second thin pad having a thickness smaller than the thickness of the third insulating structure,
    wherein the third insulating structure comprises a top surface, the first thin pad extends onto the top surface of the third insulating structure or the second thin pad extends onto the top surface of the third insulating structure.

8. The light-emitting device according to claim 7, wherein the second electrode is surrounded by the first electrode in a top view of the light-emitting device.

9. The light-emitting device according to claim 7, wherein the semiconductor structure comprises a via penetrating the second semiconductor layer and the active layer to expose a surface of the first semiconductor layer.

10. The light-emitting device according to claim 7, wherein the first electrode and the second electrode occupy 40% above of a light-emitting area of the light-emitting device.

11. The light-emitting device according to claim 7, further comprising a second insulating structure formed under the second electrode, wherein the second insulating structure comprises multiple sidewalls covered by the second electrode.

12. The light-emitting device according to claim 7, wherein the first electrode and the second electrode are separated apart by a distance smaller than 50 μm.

13. A light-emitting device, comprising:
    a semiconductor structure comprising a first semiconductor layer, a second semiconductor layer, and an active layer between the first semiconductor layer and the second semiconductor layer;
    a first electrode formed on the first semiconductor layer and electrically connected to the first semiconductor layer;
    a second electrode formed on the second semiconductor layer and electrically connected to the second semiconductor layer;
    a third insulating structure covering the first electrode, the second electrode and the semiconductor structure, the third insulating structure comprising a first opening to expose the first electrode and a second opening to expose the second electrode;
    a first thin pad formed in the first opening, the first thin pad having a thickness smaller than a thickness of the third insulating structure; and
    a second thin pad formed in the second opening, and the second thin pad having a thickness smaller than the thickness of the third insulating structure, wherein the third insulating structure comprises a top surface, the first thin pad extends onto the top surface of the third insulating structure or the second thin pad extends onto the top surface of the third insulating structure.

14. The light-emitting device according to claim 13, wherein the second electrode is surrounded by the first electrode in a top view of the light-emitting device.

15. The light-emitting device according to claim 13, wherein the semiconductor structure comprises a part penetrating the second semiconductor layer and the active layer to expose a surface of the first semiconductor layer.

16. The light-emitting device according to claim 15, wherein the part is at an outer periphery of the semiconductor structure and surrounds the outer periphery of the semiconductor structure.

17. The light-emitting device according to claim 16, wherein the first electrode is formed at the part.

18. The light-emitting device according to claim 15, wherein the first electrode is formed at the part.

19. The light-emitting device according to claim 13, wherein the first electrode and the second electrode occupy 40% above of a light-emitting area of the light-emitting device.

* * * * *